(12) United States Patent
Tanaka

(10) Patent No.: US 7,408,416 B2
(45) Date of Patent: Aug. 5, 2008

(54) PHASE LOCKED LOOP, SIGNAL GENERATING APPARATUS AND SYNCHRONIZATION METHOD

(75) Inventor: Ryuta Tanaka, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 86 days.

(21) Appl. No.: 11/439,263

(22) Filed: May 24, 2006

(65) Prior Publication Data
US 2006/0267692 A1 Nov. 30, 2006

(30) Foreign Application Priority Data
May 24, 2005 (JP) .......................... P.2005-151658

(51) Int. Cl.
*H03L 7/00* (2006.01)
(52) U.S. Cl. .......................... 331/16; 331/175; 331/1 A; 332/117; 332/127; 455/260
(58) Field of Classification Search .................. 331/16, 331/1 A, 175; 455/260; 332/117, 127
See application file for complete search history.

(56) References Cited

U.S. PATENT DOCUMENTS 5,256,981 A * 10/1993 Fountain ...................... 327/69

7,215,215 B2 * 5/2007 Hirano et al. ............... 332/128

FOREIGN PATENT DOCUMENTS

| JP | 1-129615 A | 5/1989 |
| JP | 2002-290155 A | 10/2002 |

* cited by examiner

*Primary Examiner*—Arnold Kinkead
(74) *Attorney, Agent, or Firm*—Sughrue Mion, PLLC

(57) ABSTRACT

A phase locked loop for outputting a high frequency signal by executing synchronization and frequency conversion based on an input signal includes a control-type oscillator, and a phase comparator circuit for comparing a phase of the input signal and a phase of an output signal from the control-type oscillator, and outputting and supplying a phase error signal to the control-type oscillator via a loop filter. The phase locked loop further includes a correction signal generating circuit for adding a high frequency component of the phase error signal outputted from the phase comparator circuit to the phase error signal as a correction signal. In accordance with this phase locked loop, the high frequency component of the phase error signal outputted from the phase comparator circuit is added to an output signal of a loop filter as the correction signal so that a flat frequency characteristic can be acquired over a broad band.

18 Claims, 10 Drawing Sheets

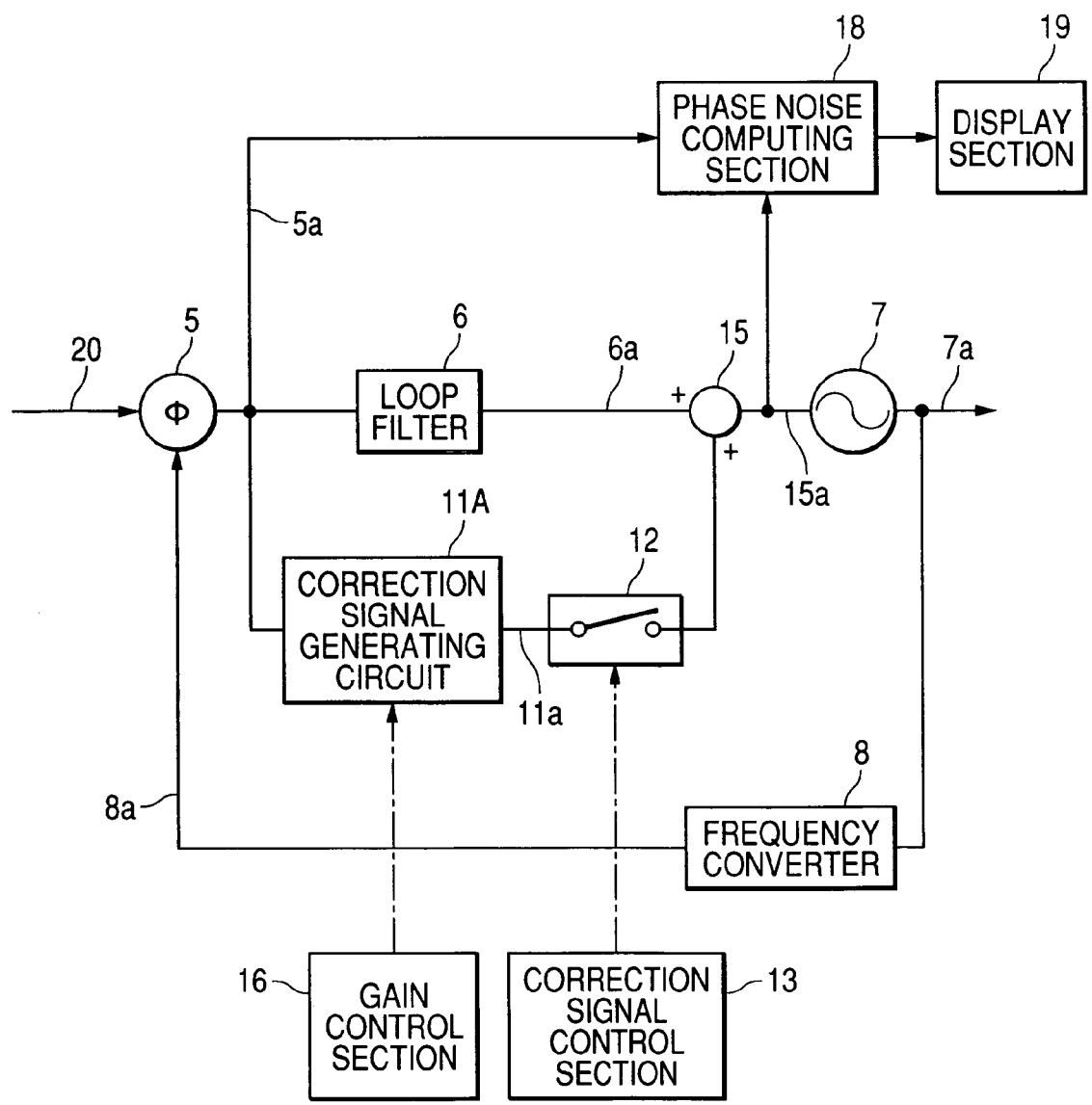

PHASE LOCKED LOOP, SIGNAL GENERATING APPARATUS AND SYNCHRONIZATION METHOD

This application claims foreign priority based on Japanese Patent application No. 2005-151658, filed May 24, 2005, the content of which is incorporated herein by reference in its entirety.

BACKGROUND OF THE INVENTION

1. Field of the Invention

This invention relates to a phase locked loop, a signal generating apparatus and a synchronization method wherein a phase error signal outputted from a phase comparator circuit is supplied to a control-type oscillator so as to execute synchronization and frequency conversion based on an input signal, thereby outputting a high frequency signal.

2. Description of the Related Art

FIG. 6 is a block diagram of a related phase locked loop (PLL: Phase Locked Loop). Such a phase locked loop is widely applied to a signal generating apparatus such as a digital modulation signal generating apparatus, and also to various devices.

The phase locked loop shown in FIG. 6 includes a reference signal generator 101, a phase comparator circuit 105, a loop filter 106, a control-type oscillator 107, a frequency converter 108 such as a frequency divider, and a modulation signal generator 109.

While modulation is not performed, an output signal 107a synchronous with a reference signal 101a from the reference signal generator 101 is outputted from the control-type oscillator 107.

While the modulation is performed, a modulation signal 109a generated by the modulation signal generator 109 is added to an output signal 106a from the loop filter 106, thus producing a control signal for the control-type oscillator 107. (For example, refer to JP-A-2002-290155 and JP-A-1-129615.)

In the phase-locked loop shown in FIG. 6, the modulation signal is added to the frequency adjusting terminal of the control-type oscillator so that the control-type oscillator is directly modulated by the modulation signal.

However, in this case, as seen from FIG. 7, the phase locked loop has a highpass characteristic with respect to a modulation input. Therefore, in order to perform the modulation at a low frequency, the loop band must be sufficiently narrow with respect to the modulation frequency. However, narrowing the loop band facilitates the modulation at the low frequency, but also narrows the lock-in range. This leads a problem of making it difficult to acquire the synchronization of the loop. There is also a problem of making it impossible to effect the modulation from DC because of the highpass characteristic.

In order to make the modulation gain flat, a configuration as shown in FIG. 8 can be adopted.

In the example of FIG. 8, a modulation signal 109a generated by a modulation signal generator 109 is supplied to a modulator 110 through a modulator-input circuit 111, thereby generating a modulated wave 110a. Thus, the loop outputs, from the control-type oscillator 107, the output signal 107a synchronous with the modulated wave 110a. On the other hand, a correction signal 112a generated by a correction signal generating circuit 112 is added to the output signal 106a from the loop filter 106, thus producing the control signal for the control-type oscillator 107.

In this way, the modulation signal 109a is applied to the modulator 110 to produce the modulated wave, and also a part of the modulation signal 109a is branched to generate the correction signal 112a, and the correction signal 112a is added to the frequency adjusting terminal of the control-type oscillator 107. In this example, within the loop band, the control-type oscillator 107 outputs the modulated wave in synchronism with the modulated wave 110a from the modulator 110, whereas outside the loop band, the control-type oscillator 107 is directly modulated by the correction signal 112a. Thus, as seen from FIG. 9A, a broad band frequency characteristic can be obtained.

However, in this case, the modulation sensitivity of the modulator 110 must be matched with the frequency characteristic of the phase locked loop. To this end, a circuit for adjusting the gain of the correction signal and the frequency characteristic must be externally provided. In order to determine the characteristic of such an adjusting circuit, the frequency characteristic of the loop filter 106, phase detecting sensitivity of the phase comparator circuit 105 and frequency characteristic of the control-type oscillator 107 must be obtained exactly. This leads to a problem of making it difficult to provide a flat frequency characteristic over a broad band. For example, as seen from FIG. 9B, irregularity in the frequency characteristic is likely to occur.

Further, as seen from FIG. 10, synchronization may be ensured in a state with the lock-in range extended by making the element constant of the loop filter variable. In the example shown in FIG. 10, the constant of a loop filter 106A is switched by a constant switch 113, thereby making the loop band variable. Thus, the loop band can be appropriately selected according to the synchronizing process in the loop and the status while modulation is not performed or modulation.

In this case, in order to change the element constant, an analog switch is employed. However, in order to improve the phase noise characteristic of the loop, the element constant must be set at a low value from the point of view of suppressing thermal noise. On the other hand, there is a limit in reducing the resistance of the element constant because of the on-resistance of the analog switch. This leads to a problem of being incapable of providing the phase locked loop with an excellent phase noise.

In view of the above circumstance, it is desirable to provide a phase locked loop enabling the modulation from DC and capable of easily giving the modulation having a flat frequency characteristic over a broad band without reducing the lock-in range of the loop. Further, it is desirable to enable the modulation without providing a correction signal externally from the phase locked loop and determine the element constant of a loop filter without depending on the on-resistance of the analog switch

SUMMARY OF THE INVENTION

The present invention has been made in view of the above circumstances, and provides a phase locked loop, a signal generating apparatus and a synchronization method capable of easily acquiring a flat frequency characteristic over a broad band while ensuring a large lock-in range.

In some implementations, a phase locked loop of the invention for outputting a high frequency signal by executing synchronization and frequency conversion based on an input signal comprising:

a control-type oscillator;

a phase comparator circuit for comparing a phase of the input signal and a phase of an output signal from the control-type oscillator, and outputting and supplying a phase error signal to the control-type oscillator; and a correcting section for adding a high frequency component of the outputted phase error signal to the outputted phase error signal as a correction signal.

In accordance with this phase locked loop, a high frequency component of a phase error signal outputted from the phase comparator circuit is added to the phase error signal as the correction signal so that a flat frequency characteristic over a broad band can be acquired.

The phase locked loop of the invention may include a switching section for turning on and off a correction by the correcting section.

In this case, the frequency characteristic can be selected depending on situations.

The phase locked loop of the invention may include a correction amount adjusting section for adjusting a correction amount of the correcting section.

In this case, the frequency characteristic can be changed depending on the situations.

The phase locked loop of the invention may include a frequency converter for converting a frequency of the output signal from the control-type oscillator into a low frequency according to a reference frequency signal as the input signal, and feeding back the low frequency to the phase comparator circuit.

The phase locked loop of the invention may include:

a phase noise detecting section for detecting a phase noise in the phase locked loop; and a display for displaying the detected phase noise.

In some implementations, a signal generating apparatus of the invention comprises;

a frequency modulator circuit for executing frequency modulation based on a modulation signal; and the phase locked loop according to the invention, wherein an output signal from the frequency modulator circuit is supplied to the phase comparator circuit of the phase locked loop as the input signal.

In some implementations, a signal generating apparatus of the invention comprises:

a phase modulator circuit for executing phase modulation based on a modulation signal; and the phase locked loop according to the invention, wherein an output signal from the phase modulator circuit
 is supplied to the phase comparator circuit of the phase locked loop as the input signal.

In some implementations, a signal generating apparatus of the invention comprises:

a phase locked loop including a control-type oscillator, a phase comparator circuit and a correcting section, the phase comparator circuit comparing a phase of an input signal and a phase of an output signal from the control-type oscillator, and the correcting section adding a high frequency component of a phase error signal being outputted from the phase comparator circuit to the outputted phase error signal as a correction signal, and supplying the phase error signal to which the high frequency component is added to the control-type oscillator;

a frequency modulator circuit for executing frequency modulation based on a modulation signal, and supplying an output signal to the phase comparator circuit of the phase locked loop as the input signal; and a switching section which turns on a correction by the correcting section while the frequency modulation in the frequency modulator circuit is performed, and turns off the correction by the correcting section while the frequency modulation in the frequency modulator circuit is not performed.

In accordance with the signal generating apparatus, while the modulation is performed in the frequency modulator circuit, the correction by the correcting section is turned on, whereas while the modulation is not performed in the frequency modulator circuit, the correction by the correcting section is turned off. For this reason, the stability of the operation while the modulation is not performed and the broad band characteristic while the modulation is performed can be compatible.

In some implementations, a signal generating apparatus of the invention comprises:

a phase locked loop including a control-type oscillator, a phase comparator circuit and a correcting section, the phase comparator circuit comparing a phase of an input signal and a phase of an output signal from the control-type oscillator, and the correcting section adding a high frequency component of a phase error signal being outputted from the phase comparator circuit to the outputted phase error signal as a correction signal, and supplying the phase error signal to which the high frequency component is added to the control-type oscillator;

a phase modulator circuit for executing phase modulation based on a modulation signal, and supplying an output signal to the phase comparator circuit of the phase locked loop as the input signal; and a switching section which turns on a correction by the correcting section while the phase modulation in the phase modulator circuit is performed, and turns off the correction by the correcting section while the phase modulation in the phase modulator circuit is not performed.

In accordance with the signal generating apparatus, while the modulation is performed in the phase modulator circuit, the correction by the correcting section is turned on whereas while the modulation is not performed in the phase modulator circuit, the correction by the correcting section is turned off. For this reason, the stability of the operation while the modulation is not performed and the broad band characteristic while the modulation is performed can be compatible.

In some implementations, a synchronization method of the invention in a phase locked loop for outputting a high frequency signal by executing synchronization and frequency conversion based on an input signal comprises:

comparing a phase of the input signal and a phase of an output signal from a control-type oscillator so as to output a phase error signal and supply the phase error signal to the control-type oscillator;

adding a high frequency component of the outputted phase error signal to the outputted phase error signal as a correction signal so as to ensure synchronization in a state of an extended lock-in range; and stopping adding the correction signal to the phase error signal after the synchronization is ensured.

In accordance with this synchronization method, by adding the phase error signal as the correction signal, the synchronization is ensured in a state with an extended lock-in range, and after the synchronization has been ensured, the correction signal is not added to the phase error signal. For this reason, the extended lock-in range and the stability of the operation after synchronization has been ensured can be compatible.

In accordance with this phase locked loop, a high frequency component of a phase error signal outputted from the phase comparator circuit is added to the phase error signal as the correction signal so that a flat frequency characteristic over a broad band can be acquired.

In accordance with the signal generating apparatus, while the modulation is performed in the frequency modulator circuit, the correction by the correcting section is turned on, whereas while the modulation is not performed in the frequency modulator circuit, the correction by the correcting section is turned off. For this reason, the stability of the operation while the modulation is not performed and the broad band characteristic while the modulation is performed can be compatible.

In accordance with the signal generating apparatus, while the modulation is performed in the phase modulator circuit, the correction by the correcting section is turned on, whereas while the modulation is not performed in the phase modulator circuit, the correction by the correcting section is turned off. For this reason, the stability of the operation while the modulation is not performed and the broad band characteristic while the modulation is performed can be compatible.

In accordance with this synchronization method, by adding the phase error signal as the correction signal, the synchronization is ensured in a state with an extended lock-in range, and after the synchronization has been ensured, the correction signal is not added to the phase error signal. For this reason, the extended lock-in range and the stability of the operation after synchronization has been ensured can be compatible.

BRIEF DESCRIPTION OF THE DRAWINGS

FIG. 3 is a block diagram showing a configuration of a measuring system using the phase locked loop according to an embodiment of the invention.

DESCRIPTION OF THE PRFERRED EMBODIMENTS

An explanation will be given of various embodiments of the phase-locked loop according to this invention.

First Embodiment

Now referring to FIGS. 1 and 2, an explanation will be given of the first embodiment of the phase locked loop according to this invention.

Figure 1:
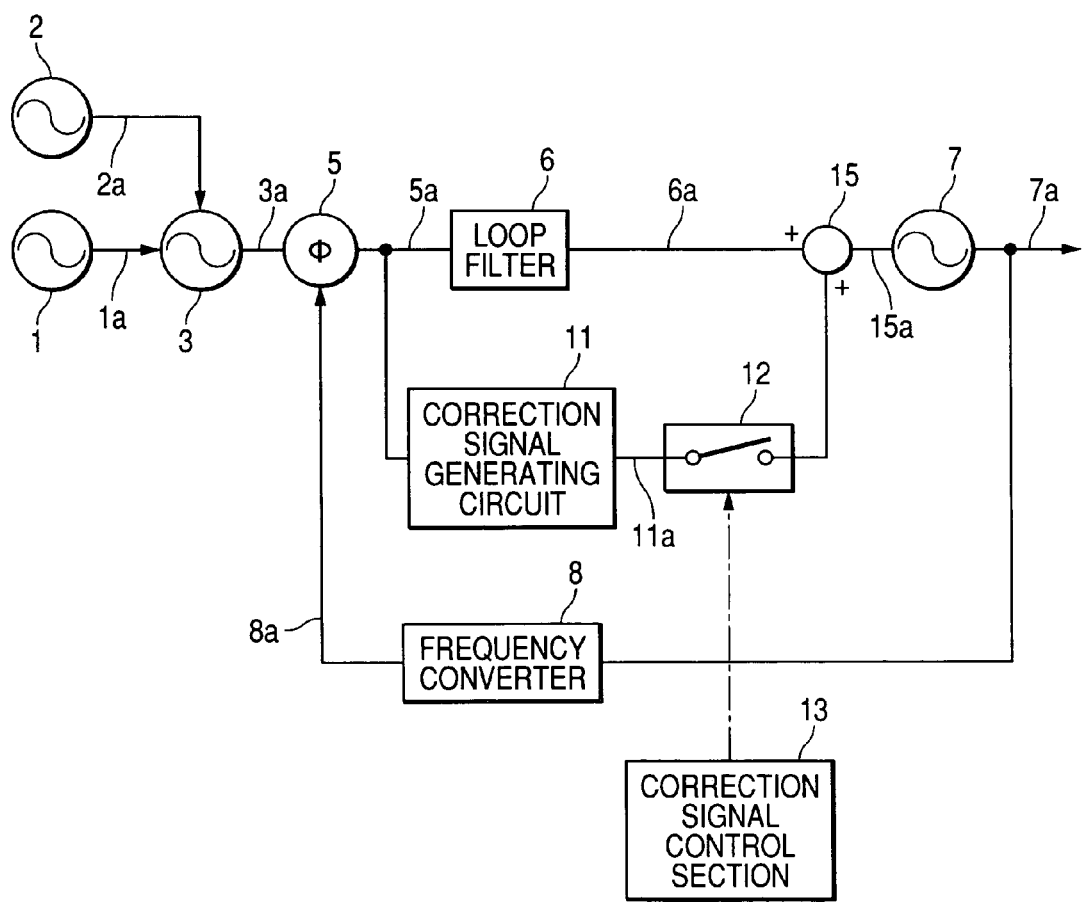
FIG. 1 is a block diagram showing a configuration of a signal generator using a phase locked loop according to an embodiment of the invention.

FIG. 1 is a block diagram showing a configuration of a signal generator using a phase locked loop according to the first embodiment of this invention.

The signal generator shown in FIG. 1 includes a reference signal generator 1 for generating a reference signal 1a, a modulation signal generator 2 for generating a modulation signal 2a, a modulator 3 for generating a modulated wave 3a, a phase comparator circuit 5, a loop filter 6, a control-type oscillator 7, and a frequency converter 8 such as a frequency divider. The modulator 3 may execute frequency modulation or phase modulation.

The loop filter 6, control-type oscillator 7, frequency converter 8 and phase comparator 5 constitute a phase locked loop (PLL; Phase Locked Loop). While modulation is not performed, the control-type oscillator 7 outputs an output signal 7a in synchronism with a reference signal 1a outputted from the reference signal generator 1. The frequency converter 8 generates a converted signal 8a with a low frequency shifted from the frequency of the output signal 7a and supplies it to the phase comparator circuit 5.

While modulation is not performed, the reference signal 1a from the reference signal generator 1 is supplied to the phase comparator circuit 5. The phase comparator circuit 5 compares the phase of the reference signal 1a with that of the converted signal 8a. While the modulation is performed, a modulation signal 2a from a modulation signal generator 2 is supplied to the modulator 3 to generate a modulated wave 3a. The modulated wave 3a is supplied to the phase comparator circuit 5. The phase comparator circuit 5 compares the phase of the modulated wave 3a with that of the converted signal 8a. A phase error signal 5a outputted from the phase comparator circuit 5 is supplied to the loop filter 6.

As seen from FIG. 1, within the phase locked loop, there are provided a correction signal generating circuit 11 to which the phase error signal 5a outputted from the phase comparator circuit 5 is supplied and a switching section 12 connected to the output side of the correction signal generating circuit 11. On/off of the switching section 12 is controlled by the signal from the correction signal control section 13. If the switching section 12 is "on", an adder 15 adds a correction signal 11a outputted from the correction signal generating circuit 11 to an output signal 6a from the loop filter 6. A control signal 15a outputted from the adder 15 is supplied to a frequency adjusting terminal of the control-type oscillator 7. If the switching section 12 is "off", the output signal 6a from the loop filter 6 is applied as control signal 15a, as it is, to the frequency adjusting terminal of the control-type oscillator 7.

Figure 2A:
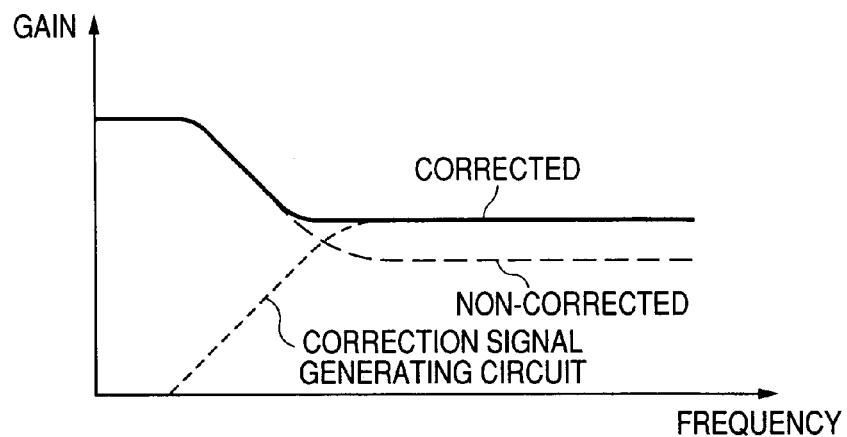
FIG. 2a is a graph showing a frequency characteristic of a circuit inclusive of a loop filter and a correction signal generating circuit.
Figure 2B:
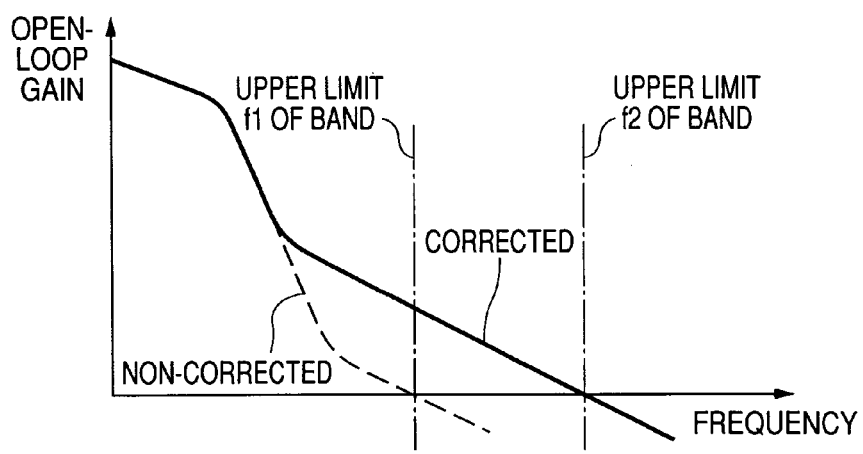
FIG. 2B is a graph showing a frequency characteristic of an open-loop gain of the phase locked loop.
Figure 2C:
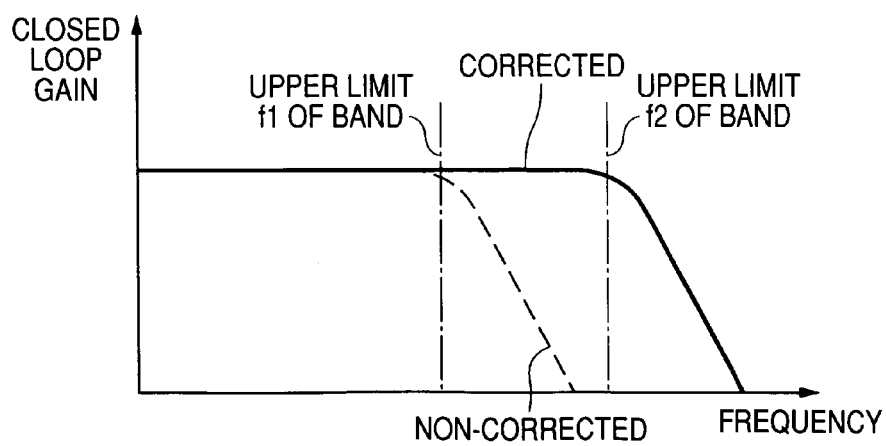
FIG. 2C is a graph showing a frequency characteristic of a closed-loop gain of the phase locked loop.

FIG. 2A is a graph showing a frequency characteristic of the circuit inclusive of the loop filter 6 and correction signal generating circuit 11. FIG. 2B is a graph showing a frequency characteristic of an open-loop gain of the phase locked loop. FIG. 2C is a graph showing a frequency characteristic of a closed-loop gain of the phase locked loop.

As seen from FIG. 2A, in this embodiment, where the correction signal 11a from the correction signal generating circuit 11 is added thereby to correct the output signal 6a from the loop filter 6, the frequency band of the control signal 15a is extended to a higher frequency side. In FIG. 2B, a long-broken line represents the characteristic of the loop filter 6 in a case where no correction is executed, whereas a solid line represents the characteristic thereof in a case where the correction is executed. Further, a short-broken line represents the frequency characteristic of the correction signal 11a outputted from the correction signal generating circuit 11. Thus, the correction signal generating circuit 11 exhibits a characteristic with the gain increased in a higher frequency range. Such a characteristic can be acquired by using e.g. a circuit including an amplifier and a bypass filter as the correction signal generating circuit 11.

In FIG. 2B, a long-broken line represents the frequency characteristic of the open loop gain of the phase locked loop in the case where no correction is executed; and a short-broken line represents the frequency of the open loop gain of the phase locked loop in the case where the correction is executed.

In FIG. 2C, a long-broken line represents the frequency characteristic of the closed-loop gain of the phase locked loop in the case where no correction is executed; and a short-broken line represents the frequency of the closed-loop gain of the phase locked loop in the case where the correction is executed.

As seen from FIGS. 2B and 2C, by the correction of adding the correction signal 11*a*, the upper limit of the frequency band of the phase locked loop is extended from a band upper limit f1 to another band upper limit f2.

Next, the operation of the signal generator will be explained.

First, in actuating the signal generator, the switching section 12 is turned on by the signal supplied from the correction control section 13, thereby setting the state where the output signal 6*a* from the loop filter 6 is corrected by the correction signal 11*a*. Thus, the lock-in range in the synchronization process in the phase locked loop can be extended, thereby stably setting the oscillation frequency of the control-type oscillator 7 at a predetermined frequency. In the synchronization process in the phase locked loop, the modulation signal 2*a* from a modulation signal generator 2 is not supplied to the modulator 3 so that the modulating operation is not executed.

Next, the switching section 12 is turned off by the signal supplied from the correction signal control section 13, thereby setting the state where the output signal 6*a* is supplied to the control-type oscillator 7 as it is without being corrected. Thus, the frequency band of the phase locked loop can be narrowed, thereby suppressing the distortion of the oscillated waveform while maintaining the oscillation frequency of the control-type oscillator 7. In this state, the modulating operation is not executed so that the non-modulated signal waveform with less distortion is obtained from the control-type oscillator 7.

Next, the modulation signal 2*a* from the modulation signal generator 2 is supplied to the modulator 3 so that the modulator 3 starts the modulating operation. In starting the modulating operation, the switching section 12 is turned on again by the signal from the correction signal control section 13, thereby setting the state where the output signal 6*a* from the loop filter 6 is corrected by the correction signal 11*a*. Thus, through the correction, the frequency band of the phase locked loop is extended, thereby executing the modulation having a flat characteristic over a broad band.

As described above, in accordance with this embodiment, the loop band in the phase locked loop can be extended so that the loop band over the broad band while the modulation is performed can be ensured. In addition, the lock-in range in the synchronization process of the phase locked loop can be extended. Further, without giving the limitation due to the loop band to the modulated wave, the modulating operation can be executed. So the modulation from DC can be realized. Furthermore, while modulation is not performed, the correction is not done so that the output waveform with less distortion can be obtained.

Further, by increasing the open loop gain, the loop band is extended, but the correction outside the loop band is not done. For this reason, by obtaining, to a certain degree, the characteristics of the loop filter 6, phase comparator circuit 5 and control-type oscillator 7, the modulation having a flat characteristic over a broad band can be executed relatively easily.

Further, since the correction signal is generated on the basis of only the signal generated inside the phase locked loop, it is not necessary to supply the correction signal externally.

Further, in accordance with this embodiment, like the case where the elements themselves in the loop filter are changed, the influence due to the on-resistance of the analog switch does not occur. For this reason, the element constant of the loop filter can be determined without depending on the on-resistance of the analog switch.

Further, this embodiment can be modified so that the switched state of the switching section 12 can be automatically selected according to the states during the synchronizing process, non-modulation and modulation through the control by the correction signal control section 13.

Second Embodiment

Now referring to FIGS. 3 and 4, an explanation will be given of the second embodiment of the phase locked loop according to this invention.

FIG. 3 is a block diagram showing a configuration of a measuring system using the phase locked loop according the second embodiment of this invention. In FIG. 3, like reference symbols refer to like components in the first embodiment according to this invention.

Hereinafter, differences from the first embodiment will be mainly explained.

The measuring system shown in FIG. 3 includes a phase noise computing section 18 to which the phase error signal 5*a* from the phase comparator circuit 5 is supplied and a display section 19 for displaying the computed result in the phase noise computing section 18.

A correction signal generating circuit 11A corresponding to the correction signal generating circuit 11 according to the first embodiment is designed so that its gain can be changed. The gain of the correction signal generating circuit 11A is controlled by a gain control section 16.

Figure 4:
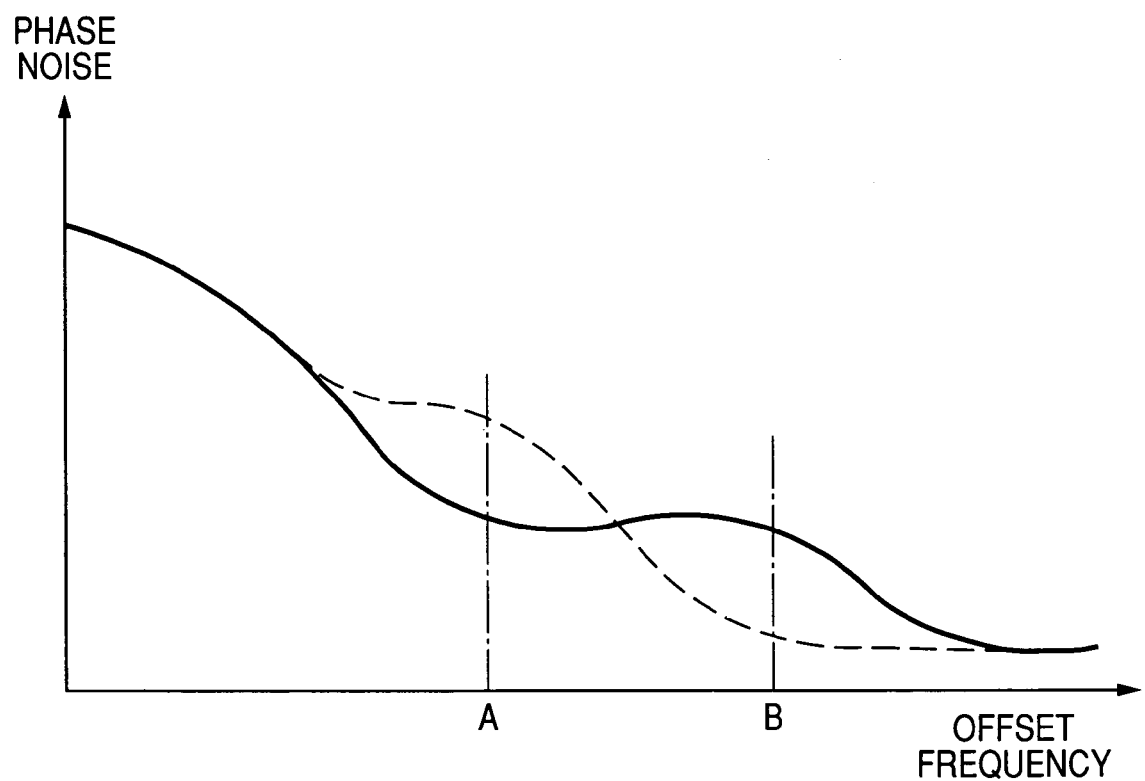
FIG. 4 is a graph showing an exemplary display on a display section.

FIG. 4 is a graph showing an exemplary display on the display section 19.

In this embodiment, when a measured signal 20 having a certain phase noise characteristic is supplied, the phase of the measured signal 20 and the phase of the converted signal 8*a* are compared with each other in the phase comparator circuit 5. The phase noise computing section 18 computes the detected result of the phase noise outside the loop band on the basis of the phase error signal 5*a* and the detected result of the phase noise inside the loop band on the basis of the control signal 15*a*, respectively. Both detected results are displayed on the display section 19 as shown in FIG. 4.

In accordance with this embodiment, the amount of correction by the correction signal 11*a* is adjusted through the gain of the correction signal generating circuit 11A so that the loop band can be made variable. For example, if the phase noise of the loop exhibits the characteristic indicated by solid line, the spurious (unnecessary wave) component indicated by "B" is buried in the phase noise of the loop and so cannot be observed. If the phase noise of the loop exhibits the characteristic indicated by broken line, the spurious component indicated by "A" is buried in the phase noise of the loop and so cannot be observed. However, in accordance with this embodiment, by adjusting the loop band, these spurious components can be observed.

In this way, the measurement of the spurious component under the condition near the measuring limit in the measuring system is controlled by the phase noise characteristic in the measuring system. For this reason, as long as a user can vary the loop band, the phase noise characteristic of the measuring system can be changed according to the property of the measured signal 20 and the measurable range under the condition near the measuring limit can be extended.

The second embodiment adopted the configuration in which the gain of the correction signal generating circuit 11A is made variable.

However, as long as the loop band is made variable, any configuration can be adopted.

Third Embodiment

Now referring to FIG. 5, an explanation will be given of the third embodiment of the phase locked loop according to this invention.

Figure 5:
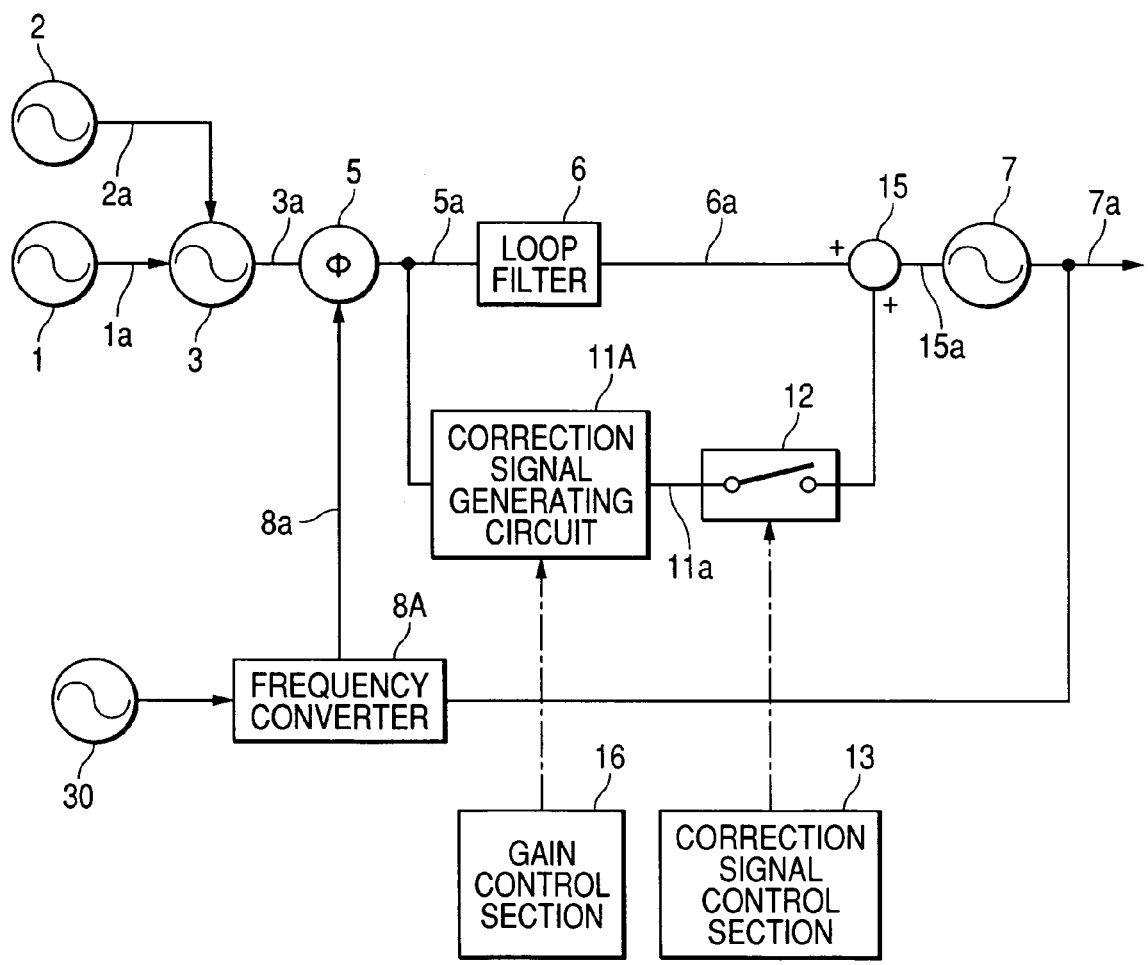
FIG. 5 is a block diagram showing a configuration of a signal generator using the phase locked loop according to an embodiment of the invention.
Figure 6:
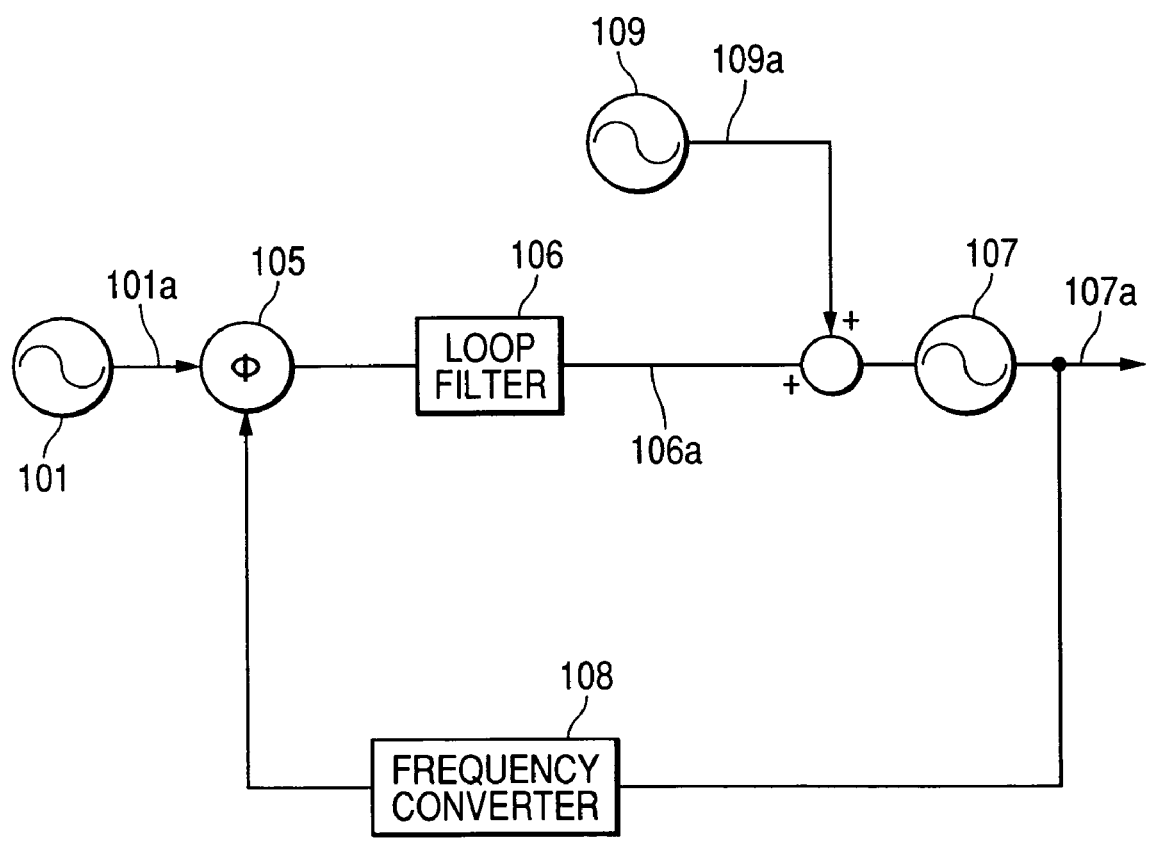
FIG. 6 is a block diagram of a related phase locked loop.
Figure 7:
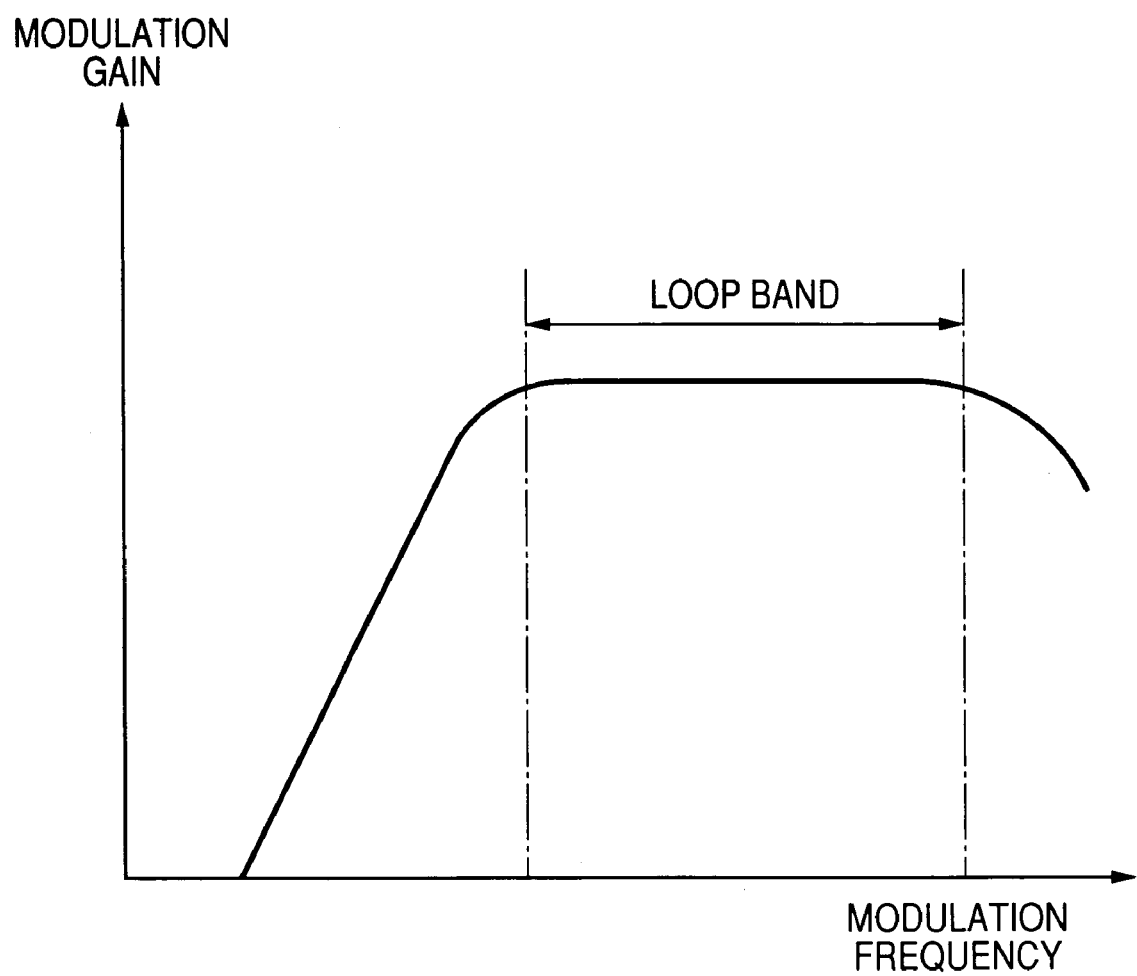
FIG. 7 is a graph showing a frequency characteristic of the related phase locked loop.
Figure 8:
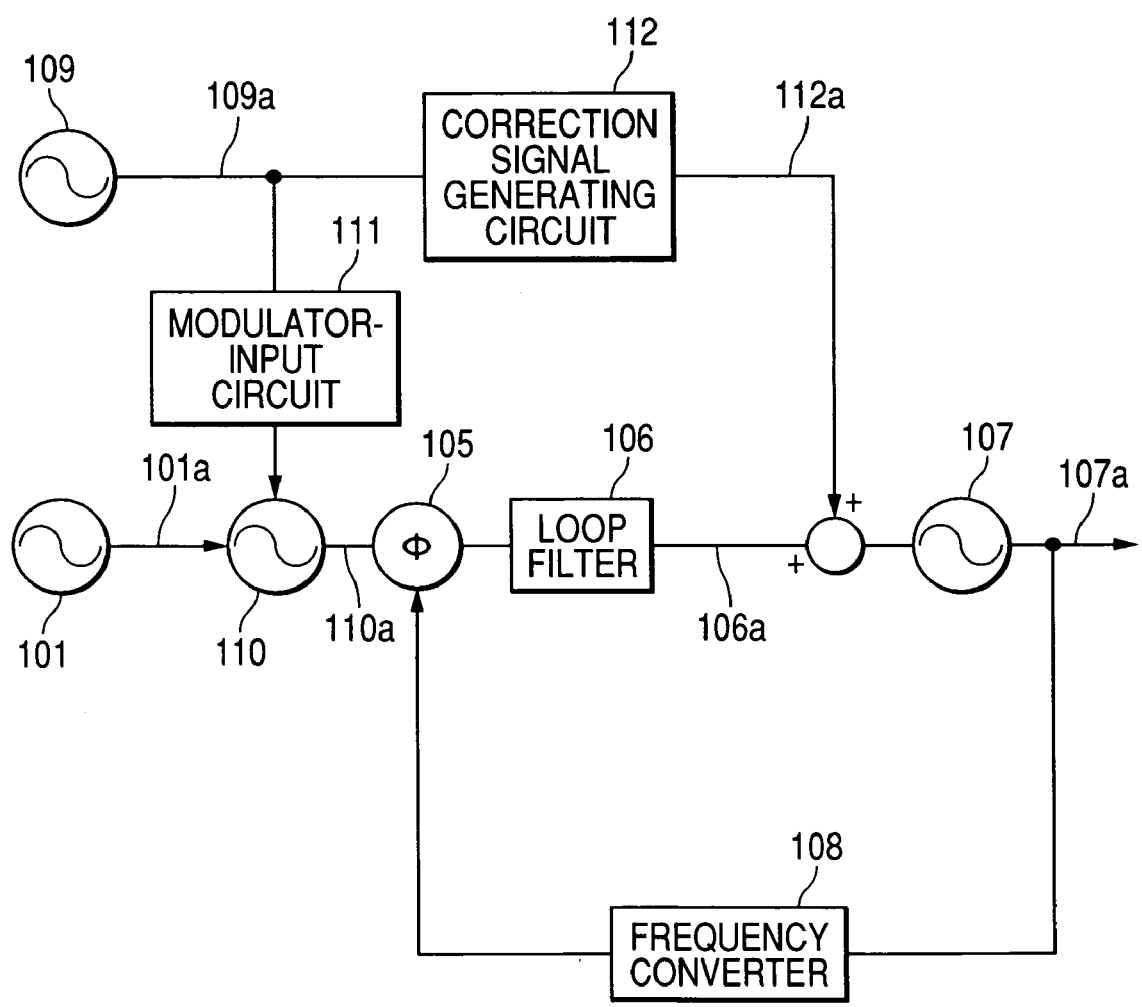
FIG. 8 is a block diagram showing a configuration of the phase locked loop for composing characteristics inside and outside a loop band.
Figure 9A:
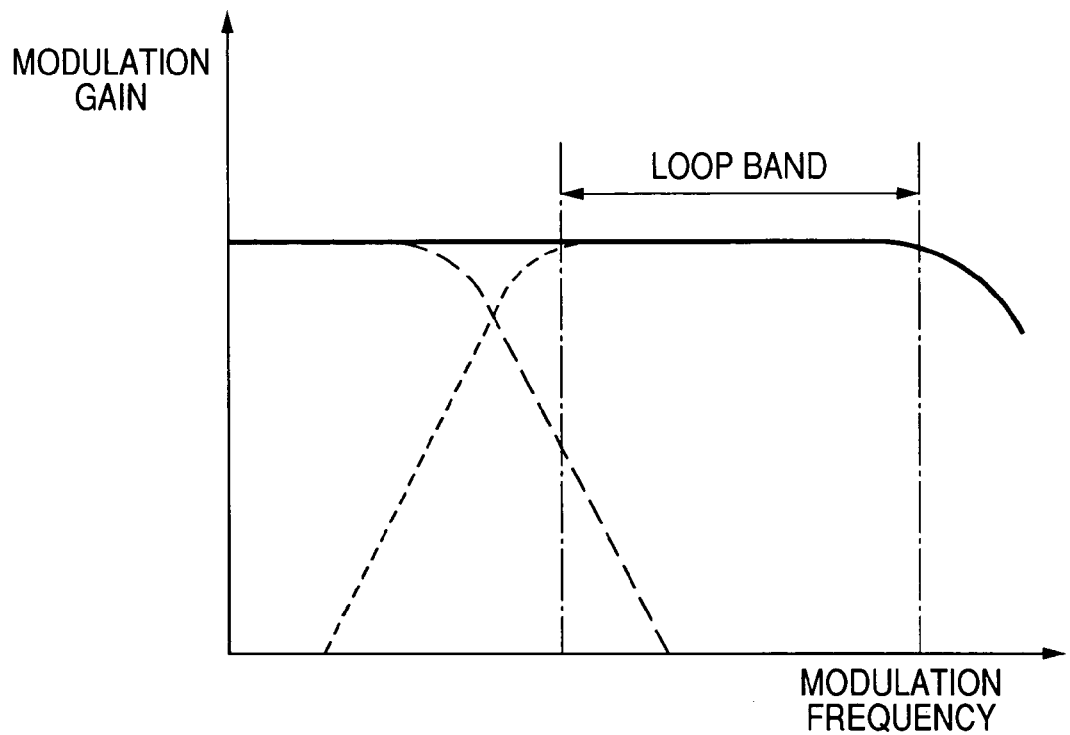
FIGS. 9A and 9B are views showing frequency characteristics of the configuration shown in FIG. 8.
Figure 9B:
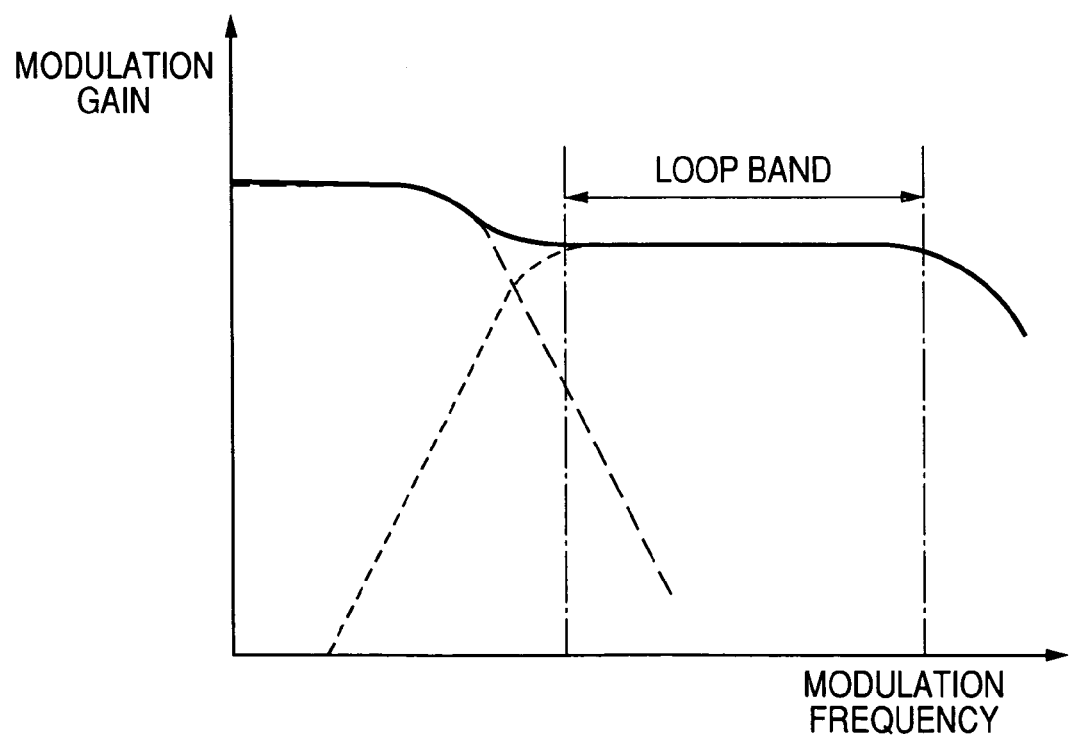
Figure 10:
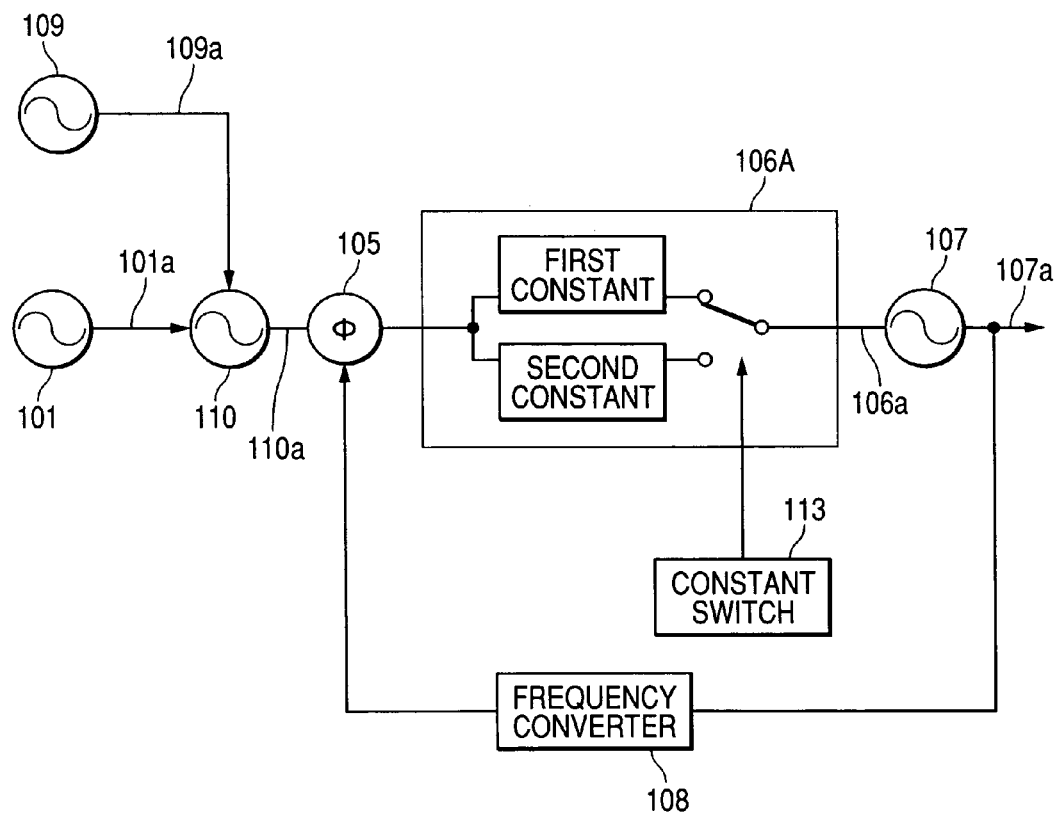
FIG. 10 is a block diagram showing a configuration of the phase locked loop in which an element constant of a loop filter is made variable.

FIG. 5 is a block diagram showing a configuration of the signal generator using the phase locked loop according the third embodiment of this invention. In FIG. 5, like reference symbols refer to like components in the first and second embodiments according to this invention. Hereinafter, differences from the first and second embodiments will be mainly explained.

The signal generator shown in FIG. 5 includes a reference signal generator 30 for supplying a reference signal to a frequency converter 8A. The frequency converter 8A may be e.g. a high frequency mixer. In this case, the oscillating frequency of the phase locked loop can be controlled through the reference signal outputted from the reference signal generator 30.

The application field of this invention should not be limited to the embodiments described above. This invention can be applied to not only the signal generating apparatus, but also widely applied to a phase locked loop which executes the synchronization and frequency conversion based on an input signal to output a high frequency signal.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A phase locked loop for outputting a high frequency signal by executing synchronization and frequency conversion based on an input signal, the phase locked loop comprising:
   a control-type oscillator;
   a phase comparator circuit for comparing a phase of the input signal and a phase of an output signal from the control-type oscillator, and outputting and supplying a phase error signal to the control-type oscillator; and
   a correcting section for adding a high frequency component of the outputted phase error signal to the outputted phase error signal as a correction signal.

2. The phase locked loop according to claim 1, further comprising:
   a switching section for turning on and off a correction by the correcting section.

3. The phase locked loop according to claim 1, further comprising:
   a correction amount adjusting section for adjusting a correction amount of the correcting section.

4. The phase locked loop according to claim 1, further comprising:
   a frequency converter for converting a frequency of the output signal from the control-type oscillator into a low frequency according to a reference frequency signal as the input signal, and feeding back the low frequency to the phase comparator circuit.

5. The phase locked loop according to claim 1, further comprising:
   a phase noise detecting section for detecting a phase noise in the phase locked loop; and
   a display for displaying the detected phase noise.

6. A signal generating apparatus comprising:
   a frequency modulator circuit for executing frequency modulation based on a modulation signal; and
   the phase locked loop according to claim 1,
   wherein an output signal from the frequency modulator circuit is supplied to the phase comparator circuit of the phase locked loop as the input signal.

7. A signal generating apparatus comprising:
   a phase modulator circuit for executing phase modulation based on a modulation signal; and
   the phase locked loop according to claim 1,
   wherein an output signal from the phase modulator circuit is supplied to the phase comparator circuit of the phase locked loop as the input signal.

8. A signal generating apparatus comprising:
   a phase locked loop including a control-type oscillator, a phase comparator circuit and a correcting section, the phase comparator circuit comparing a phase of an input signal and a phase of an output signal from the control-type oscillator, and the correcting section adding a high frequency component of a phase error signal being outputted from the phase comparator circuit to the outputted phase error signal as a correction signal, and supplying the phase error signal to which the high frequency component is added to the control-type oscillator;
   a frequency modulator circuit for executing frequency modulation based on a modulation signal, and supplying an output signal to the phase comparator circuit of the phase locked loop as the input signal; and
   a switching section which turns on a correction by the correcting section while the frequency modulation in the frequency modulator circuit is performed, and turns off the correction by the correcting section while the frequency modulation in the frequency modulator circuit is not performed.

9. A signal generating apparatus comprising:
   a phase locked loop including a control-type oscillator, a phase comparator circuit and a correcting section, the phase comparator circuit comparing a phase of an input signal and a phase of an output signal from the control-type oscillator, and the correcting section adding a high frequency component of a phase error signal being outputted from the phase comparator circuit to the outputted phase error signal as a correction signal, and supplying the phase error signal to which the high frequency component is added to the control-type oscillator;
   a phase modulator circuit for executing phase modulation based on a modulation signal, and supplying an output signal to the phase comparator circuit of the phase locked loop as the input signal; and
   a switching section which turns on a correction by the correcting section while the phase modulation in the phase modulator circuit is performed, and turns off the correction by the correcting section while the phase modulation in the phase modulator circuit is not performed.

10. A synchronization method in a phase locked loop for outputting a high frequency signal by executing synchronization and frequency conversion based on an input signal, the synchronization method comprising:

comparing a phase of the input signal and a phase of an output signal from a control-type oscillator so as to output a phase error signal and supply the phase error signal to the control-type oscillator;

adding a high frequency component of the outputted phase error signal to the outputted phase error signal as a correction signal so as to ensure synchronization in a state of an extended lock-in range; and stopping adding the correction signal to the phase error signal after the synchronization is ensured.

11. The phase locked loop according to claim 1, wherein the phase error signal output by the phase comparator circuit is supplied to the correcting section.

12. The signal generating apparatus according to claim 8, wherein the phase error signal output by the phase comparator circuit is supplied to the correcting section.

13. The signal generating apparatus according to claim 9, wherein the phase error signal output by the phase comparator circuit is supplied to the correcting section.

14. The synchronization method according to claim 10, wherein said adding is performed by a correcting section and the phase error signal is directly supplied to the correcting section.

15. The phase locked loop according to claim 1, wherein the phase error signal output by the phase comparator circuit is directly supplied to the correcting section.

16. The signal generating apparatus according to claim 8, wherein the phase error signal output by the phase comparator circuit is directly supplied to the correcting section.

17. The signal generating apparatus according to claim 9, wherein the phase error signal output by the phase comparator circuit is directly supplied to the correcting section.

18. The synchronization method according to claim 10, wherein said adding is performed by a correcting section and the phase error signal is directly supplied to the correcting section.

* * * * *